(12) United States Patent
S et al.

(10) Patent No.: US 12,120,811 B2
(45) Date of Patent: Oct. 15, 2024

(54) MULTI-DIELECTRIC PRINTED CIRCUIT BOARD

(71) Applicant: Intel Corporation, Santa Clara, CA (US)

(72) Inventors: Arvind S, Bangalore (IN); Raghavendra Rao, Bangalore (IN); Geejagaaru Krishnamurthy Sandesh, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 17/133,234

(22) Filed: Dec. 23, 2020

(65) Prior Publication Data

US 2022/0201836 A1     Jun. 23, 2022

(51) Int. Cl.
*H05K 1/02*     (2006.01)
*H05K 3/46*     (2006.01)
*H05K 1/03*     (2006.01)

(52) U.S. Cl.
CPC .......... *H05K 1/024* (2013.01); *H05K 1/0231* (2013.01); *H05K 1/0243* (2013.01); *H05K 3/4673* (2013.01); *H05K 3/4688* (2013.01); *H05K 1/0306* (2013.01); *H05K 1/036* (2013.01); *H05K 1/0366* (2013.01); *H05K 2201/0187* (2013.01)

(58) Field of Classification Search
CPC .... H05K 1/024; H05K 1/0231; H05K 1/0243; H05K 3/4673; H05K 3/4688
USPC ........................................................ 174/257
See application file for complete search history.

(56) References Cited

U.S. PATENT DOCUMENTS

| | | | | |
|---|---|---|---|---|
| 6,847,527 B2* | 1/2005 | Sylvester | ............... | H05K 1/162 |
| | | | | 257/E23.079 |
| 2007/0004844 A1* | 1/2007 | Clough | ................ | H05K 3/4676 |
| | | | | 524/565 |
| 2010/0307803 A1* | 12/2010 | Paul | .......................... | B32B 5/30 |
| | | | | 524/505 |

* cited by examiner

*Primary Examiner* — Andargie M Aychillhum
(74) *Attorney, Agent, or Firm* — Essential Patents Group, LLP

(57) ABSTRACT

A printed circuit board (PCB), comprising a first layer, the first layer comprising a first dielectric material substantially exclusively. The PCB also comprises a second layer, the second layer comprising the first dielectric material within a first region and a second dielectric material within a second region adjacent to first region. The first dielectric material has a first dielectric constant, a first coefficient of thermal expansion (CTE) and a first glass transition temperature (Tg). The second dielectric material has a second dielectric constant, a second CTE and a second Tg. The first dielectric constant is greater than the second dielectric constant. The first CTE is substantially equal to the second CTE; and the first Tg and the second Tg are greater than 150° C.

23 Claims, 13 Drawing Sheets

MULTI-DIELECTRIC PRINTED CIRCUIT BOARD

BACKGROUND

Parallel I/O interface speeds for double data rate (DDR) and synchronous dynamic random-access memory (SDRAM) are steadily increasing with each interface generation. As interface speeds increase, demand for high-performance printed circuit boards (PCBs) having data buses that are compatible with the speed requirements of modern interfaces is also on the rise. Such PCBs must carry high-speed serial data in the multi-gigabit-per-second (Gb/s) range (e.g., USB4/PCIe Gen 5 & 6/Thunderbolt having a transfer rate of >20 Gb/s) and parallel bus clock speeds greater than 3.5 GHz) without loss of signal integrity. While high-speed buses for parallel data transfer require PCB materials having a relatively high dielectric constant (Dk), serial I/O buses on the same PCB require low Dk materials to reduce capacitive losses. Serial and parallel interfaces on the same layer of PCB must share the same dielectric environment since PCBs are manufactured with only one formulation of prepreg polymer and are produced to be compositionally uniform. As a consequence, design or performance compromises may need to be acceptable as traditional methods of PCB manufacture cannot produce a PCB having two or more dielectric materials in the same layer of the PCB

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Disclosed herein is a mixed-material printed circuit board exhibiting multiple regions of high and low dielectric constant (Dk) to accommodate the needs of both serial and parallel interfaces. Parallel interfaces require I/O buses on a high-Dk material PCB, whereas serial interfaces perform optimally on low-Dk material PCBs. Placing the two types of interfaces on the same board having a homogeneous composition (e.g., prepreg) sacrifices the performance of one while favoring the other. The disclosed PCB solves this problem by providing layers and/or regions that comprise both high- and low-Dk prepreg materials.

Herein, the term "stackup" generally indicates a vertical stack of interleaved dielectric and conductive layers forming a printed circuit board. The stackup is shown in cross section, indicating the order, thicknesses and type of layers composing a PCB.

Herein, the term "prepreg" generally indicates a composite material comprising woven glass fibers impregnated with a partially cured epoxy. Prepregs are generally in the form of sheets that may be laminated over a PCB stackup.

Herein, the term "dielectric constant" indicates a measure of the dielectric permittivity of a material. Dielectric constant is symbolized throughout this disclosure by Dk.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

Figure 1A:
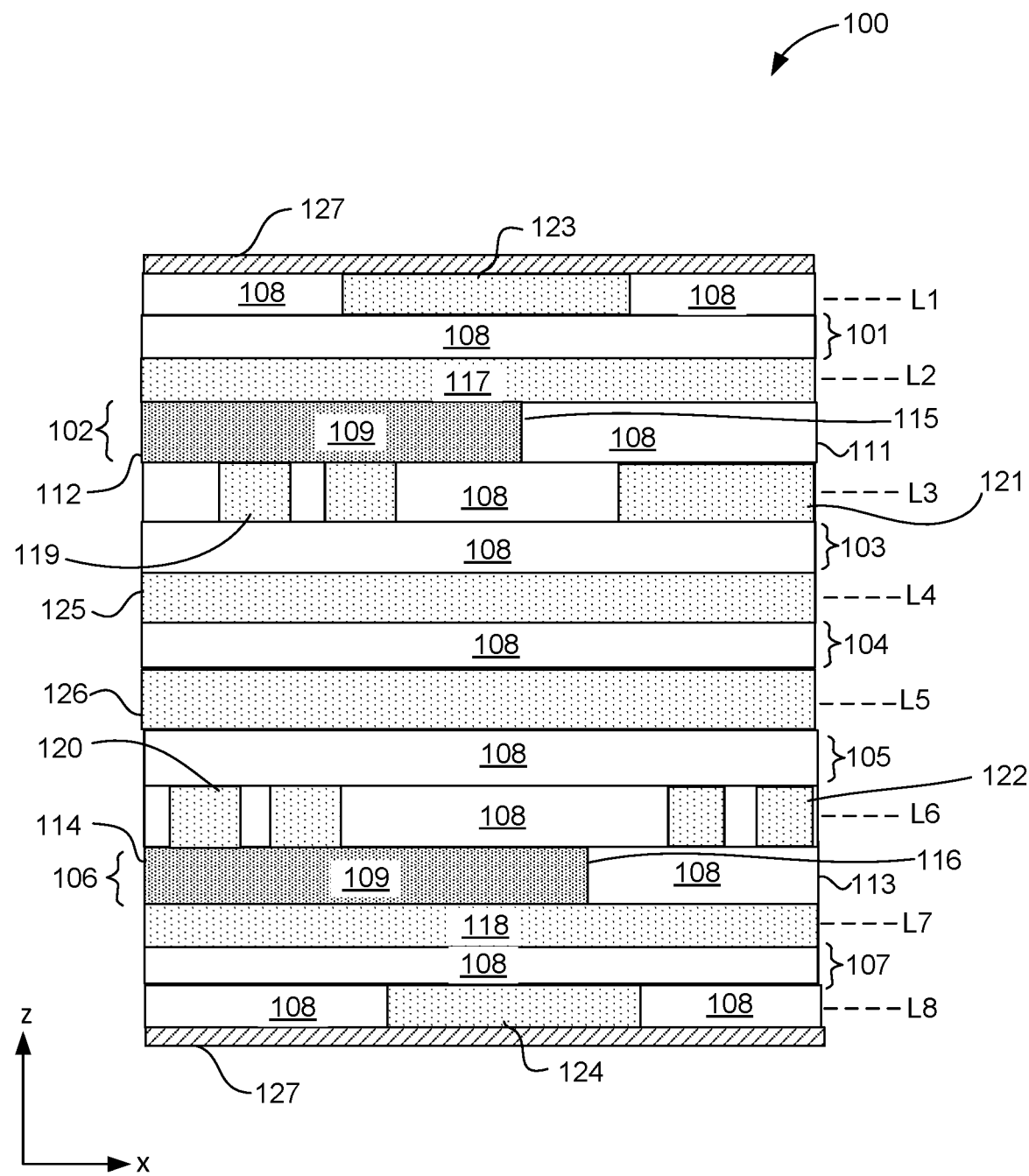
FIG. 1A illustrates a cross-sectional view in the x-z plane of a mixed-dielectric printed circuit board (PCB) comprising two dielectric materials, according to some embodiments of the disclosure.

FIG. 1A illustrates a cross-sectional view in the x-z plane of mixed-dielectric PCB 100, according to some embodiments of the disclosure.

Figure 1B:
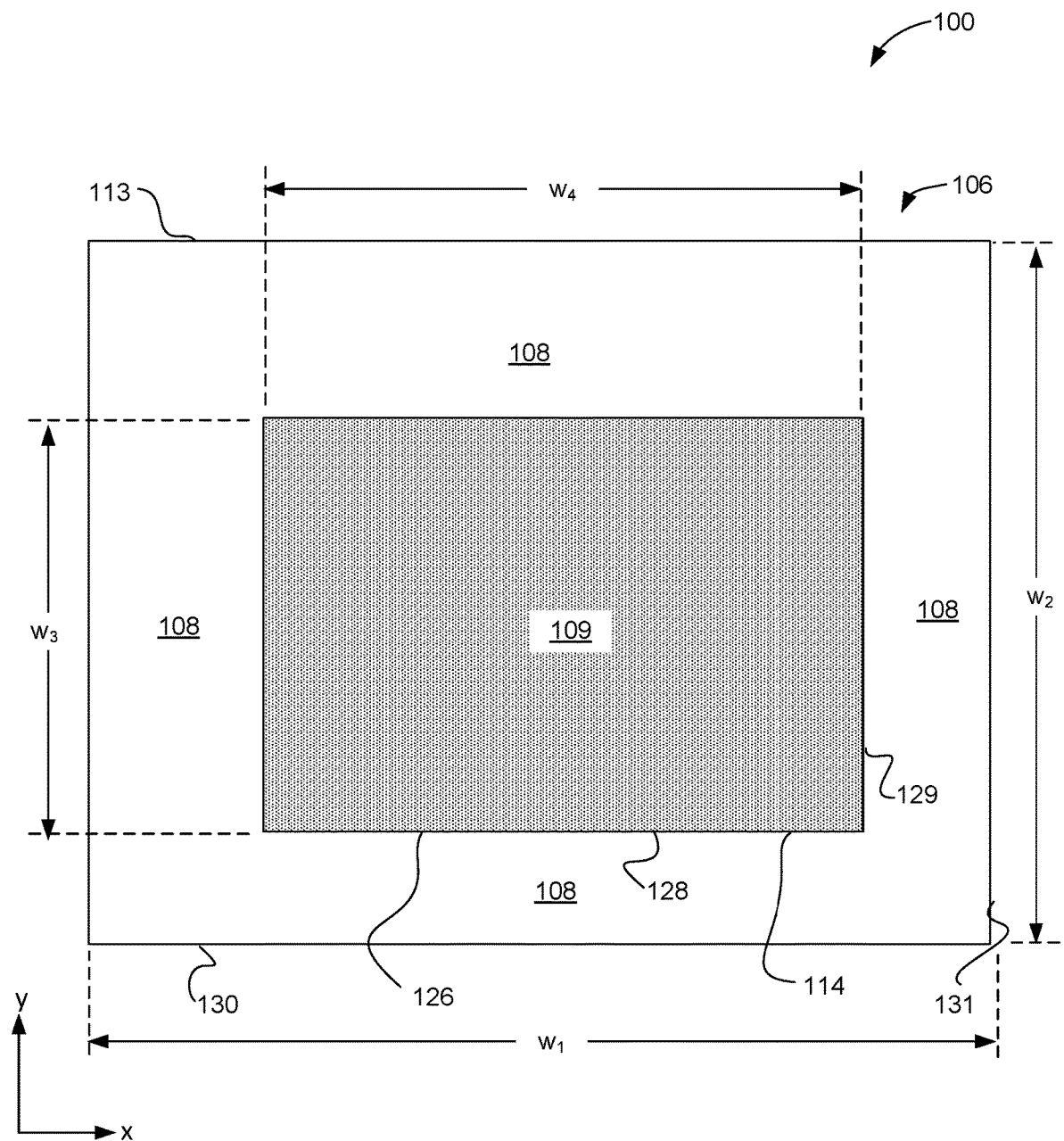
FIG. 1B illustrates a plan view in the x-y plane of a mixed dielectric layer comprising two dielectric materials of the PCB shown in FIG. 1A, according to some embodiments of the disclosure.

PCB 100 comprises an exemplary stack-up of interleaved conductive and dielectric layers. In the illustrated embodiment, multiple conductive layers labeled L1, L2, L3, L4, L5, L6, L7 and L8 are interleaved with at dielectric layers 101, 102, 103, 104, 105, 106 and 107. In some embodiments, dielectric layers 101, 103 104, 105 and 107 comprise a single dielectric material 108, thereby exhibiting a substantially uniform dielectric constant $Dk_1$ (e.g., relative permittivity $\varepsilon_r$) over the lateral extent of each layer. In some embodiments, mixed dielectric layers 102 and 106 comprise at least two dielectric materials 108 and 109, segregated into adjacent dielectric regions 111, 112, 113 and 114, respectively. In some embodiments, dielectric regions 112 and 114 may be embedded regions within host regions 111 and 113, as shown in FIGS. 1B and 2B. Dielectric material 109 may exhibit a dielectric constant $Dk_2$, where $Dk_2<Dk_1$. As an example, dielectric material 108 may comprise FR4, a common dielectric employed in PCB manufacture. FR4 may have a dielectric constant of $Dk_1$ of 4.4 measured at 1 GHz. Dielectric material 109 may exhibit a dielectric constant $Dk_2$ of 3.4, measured at 2 GHz. Dielectric materials 108 and 109 may also exhibit a loss tangent Df (e.g., tan δ) that may have an upper limit of 0.02. Other low-Dk dielectric materials, having suitable material constants may be employed as dielectric materials 108 and 109. For example, a low-Dk prepreg patch may be inlaid into a larger prepreg sheet comprising a high-Dk material. Examples of this process is described below.

In some embodiments, dielectric materials 108 and 109 have substantially the same coefficient of thermal expansion (CTE). As an example, material 108 may have an in-plane (e.g., x and y) CTE of $14 \times 10^{-6}$ m/° C. (e.g., 14 ppm/° C.). Material 109 may have an in-plane CTE of 15 ppm/° C. Optimal CTE values of dielectric materials 108 and 109 may be within 10%-20% of each other. Substantially matched CTE values of adjacent materials may avoid formation of gaps, for example, at the boundary (e.g., boundary 115 or 116) between adjacent dielectric regions 111 and 112 within mixed dielectric layer 102 or 113 and 114 within mixed dielectric layer 106.

Conductive layers L2 and L7 adjacent to mixed dielectric layers 102 and 106, respectively, may comprise ground planes 117 and 118, respectively. In some embodiments, conductive layers L3 and L6, also adjacent to mixed dielectric layers 102 and 106, may each comprise high-speed serial input/output (HSIO) interface routings 119 and 120 over regions 112 and 114 of adjacent dielectric layers 102 and 106. Regions 119 and 120 may each comprise dielectric material 109 exhibiting dielectric constant $Dk_2$.

In some embodiments, conductive layers L2 and L7 also comprise high-speed parallel trace routings 121 and 122 over regions 111 and 113 within dielectric layers 102 and 106, respectively. High-speed parallel trace routings 121 and 122 may be interfaces for high-speed memory controller and storage, for example. Regions 111 and 113 may each comprise dielectric material 108 exhibiting dielectric constant $Dk_1$, that may be at least 0.3 to 0.5 units greater than $Dk_2$. Routing HSIO traces 119 and 120 over low-Dk dielectric material (e.g., dielectric 109) may reduce dissipative power losses from high-speed signals, as low Dk may have a corresponding low Df constant or loss tangent as well.

Location of HSIO signal trace routing 119 and 120 traces over low Dk material may enable improved signal integrity relative to routing over high-Dk material. The low permittivity of dielectric 109 may limit capacitive coupling to power routing, particularly to ground planes 117 and 118. Lower capacitive coupling to an adjacent ground plane may decrease distortion of high-speed digital signals (e.g., 10 Gbit/sec or higher in recent PCIe implementations such as PCIe v.3 and higher), enabling higher frequency signals to propagate along the HSIO traces while maintaining acceptable signal integrity. Alternative methods of decreasing capacitance between HSIO traces and ground planes and power traces may include decreasing trace width and dielectric z-height.

To obtain effectively small capacitances for HSIO routing over standard PCB materials (e.g. FR4) that are compatible with multi-Gbit/sec signal speeds, line width reduction is not practical from a manufacturing point of view as required line widths are below 10 microns. Thicker dielectric layers may not be desired either as the overall z-height of a PCB may be increased. Replacing standard dielectric materials with low-Dk materials obviates the need to reduce line width beyond practical manufacturing limits or increasing dielectric layer thicknesses beyond maximum z-height specifications.

In contrast, high speed parallel trace routing 121 and 122 may extend over regions 111 and 113, respectively. Host region 111 in mixed dielectric layer 102 and host region 113 in mixed dielectric layer 106 each comprise a high-Dk dielectric material (e.g., FR4 or other material having a Dk>3.9). The high-Dk material may suit parallel interfaces comprising multiple parallel data lines more than serial data interfaces comprising relatively few data lines, due to enhanced capacitive coupling to a ground plane (e.g., ground plane 117 or 118). The enhanced capacitive coupling of the multiple parallel lines may mitigate inductively coupled cross-talk between individual lines within high-speed parallel trace routings 121 and 122. The large capacitance may shunt some inductance of high-speed trace routings 121 and 122, effectively reducing the inductance.

Additional conductive structures in the stack shown in FIG. 1A may include data trace routings 123 and 124 in top layer L1 and bottom layer L8, respectively. Conductive layers L4 and L5 may comprise power conductor trace routings 125 and 126. Dielectric material 108 may conformally penetrate into conductive layers and conformally embed the conductors, as shown. Single dielectric layer 104 comprising dielectric material 108 may be separate power conductor layers L4 and L5. Solder resists 127 on top and bottom of the stackup of PCB 100 are also shown.

FIG. 1B illustrates a plan view in the x-y plane of mixed dielectric layer 106 of PCB 100, according to some embodiments of the disclosure.

In the illustrated embodiment of FIG. 1B, region 114 may comprise a prepreg patch comprising low-Dk, low loss dielectric material 109. In the illustrated embodiment, embedded region 114 is surrounded by host region 113, whereby boundary 126 between embedded region 114 and host region 113 extends completely around the periphery (e.g., comprising edges 128 and 129) of embedded region 114. In the illustrated embodiment, region 113 may comprise a prepreg sheet that comprises high-Dk (e.g., standard FR4) dielectric material 108, as described above. Host region 113 may extend across the lateral extents (e.g., extend edge to edge in the x and y directions), having length w1 (in the x-direction) and width w2 (in the y-direction) of PCB 100. Embedded region 114 may comprise low Dk, low loss dielectric material 109, as described above. Embedded region 114 has lateral extents w3 and w4 in the x-direction and y-direction, respectively, that may be less than lateral extents w1 and w2 of host region 113. In some embodiments, one or lateral extents w3 or w4 of embedded region 114 may be substantially equal to w1 or w2 of host region 113, respectively. In some embodiments, embedded region 114 is located at a corner of host region 113, whereby two outer edges are coincident with edges 128 and 129 of embedded region 114 are coincident with edges 130 and 131 of host region 113.

As described below, high speed trace routing (e.g., HSIO routing 120) adjacent to dielectric layer 106 (e.g., L6) may extend over both host region 113 and embedded region 114, crossing over boundary 126. In some embodiments, high speed trace routing is confined to embedded region 114, and may interconnect vertically with high-speed trace routing or other conductors in another layer (e.g., mixed dielectric layer 102) within PCB 100.

Figure 2A:
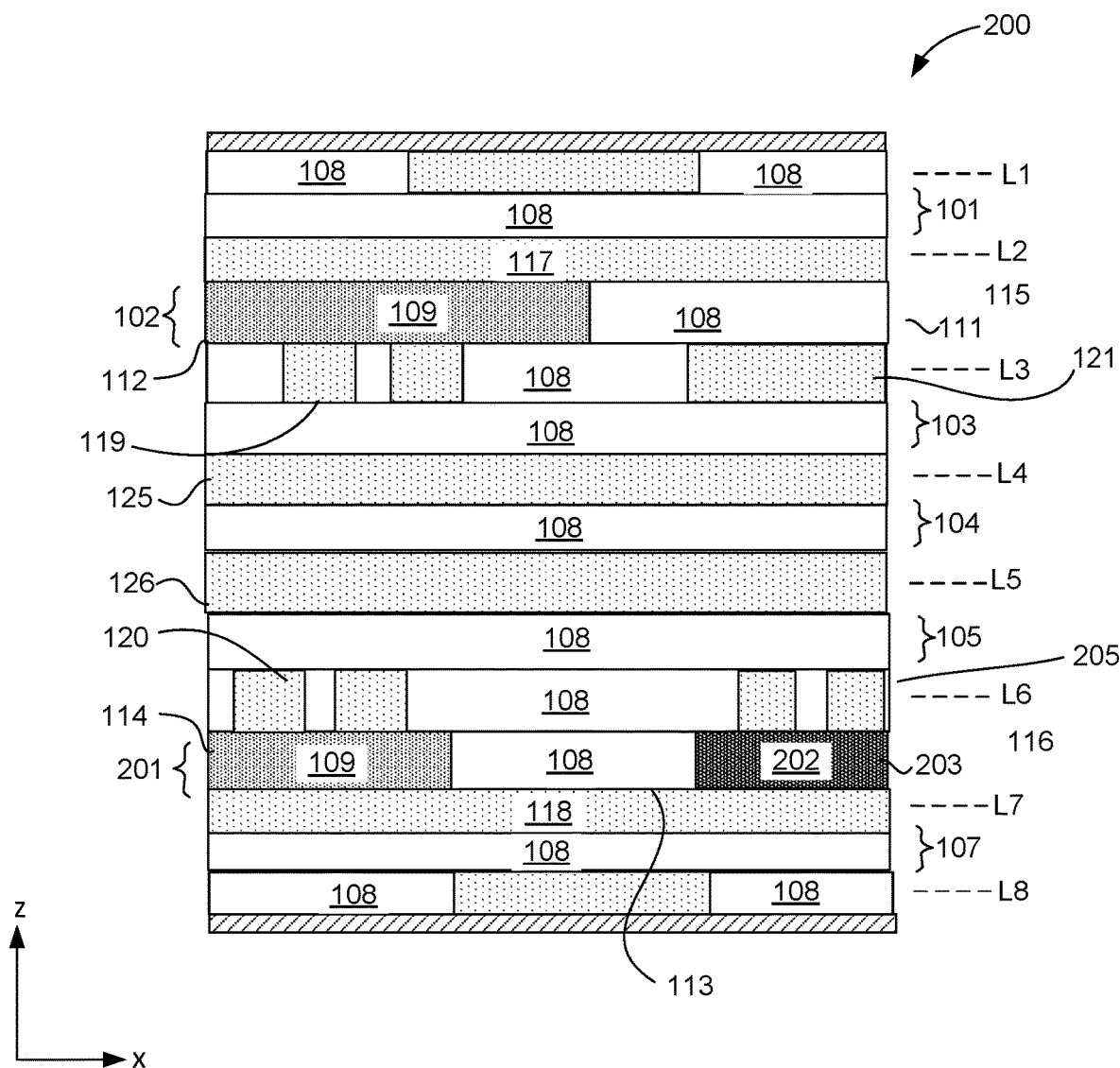
FIG. 2A illustrates a cross-sectional view in the x-z plane of a mixed-dielectric PCB comprising three dielectric materials, according to some embodiments of the disclosure.
Figure 2B:
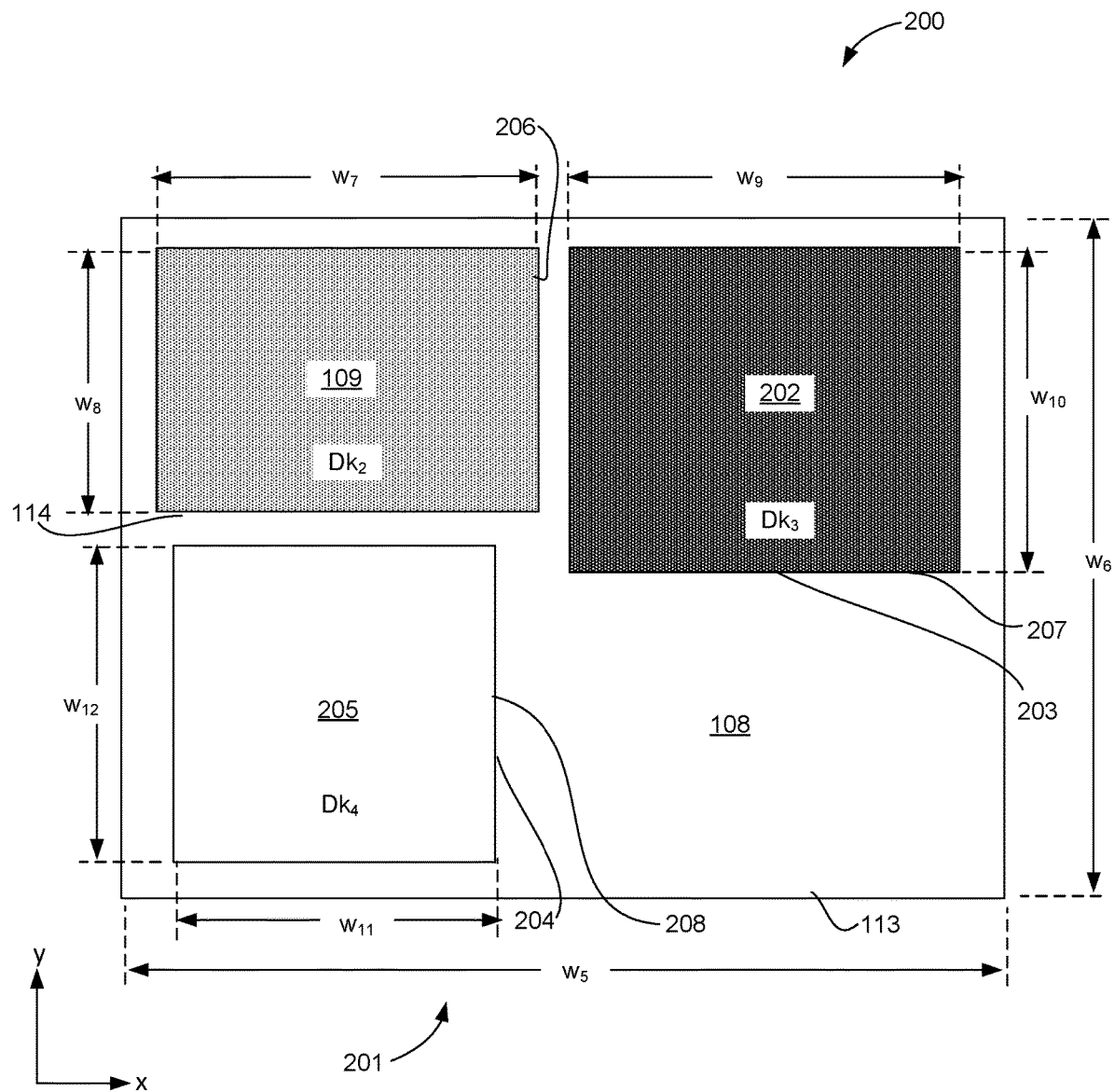
FIG. 2B illustrates a plan view in the x-y plane of mixed dielectric layer comprising three dielectric materials of the PCB shown in FIG. 2A, according to some embodiments of the disclosure.

FIG. 2A illustrates a cross-sectional view in the x-z plane of mixed-dielectric PCB 200, according to some embodiments of the disclosure.

The stackup of PCB 200 is substantially similar to the stackup of PCB 100 shown in FIG. 1A. PCB 200 comprises mixed dielectric layer 102, exhibiting two dielectric materials 108 and 109 within host region 111 and embedded region 112, respectively. PCB 200 further comprises mixed dielectric layer 201, comprising a third low-Dk, low loss dielectric material 202 within embedded region 203. In the illustrated embodiment, embedded region 203 is adjacent to host region 113. In some embodiments, embedded region 114, comprising low-Dk, low loss dielectric material 109, is also adjacent to embedded region 203. In some embodiments, low-Dk, low loss dielectric material 202 exhibits a $Dk_3$ that is less than $Dk_2$ of low-Dk, low loss dielectric material 109. In some embodiments, dielectric constant $Dk_3$ is less than 3. In some embodiments, dissipation factor $Df_3$ (e.g., loss tangent tan δ) of low-Dk, low loss material 202 may be smaller than the $Df_2$ of low-Dk dielectric material 109. As an example, $Df_3$ may range between 0.001 to 0.005 (as measured above 1 GHz), whereas $Df_2$ may range between 0.005 to 0.02 (e.g., at 2 GHz). Examples of low Dk, low loss materials may include, but not be limited to, prepregs comprising fluoropolymers (e.g., PTFE), polyimides (e.g., Kapton, UPILEX), ceramics such as alumina or ceramic-organic composites such as RF-35.

In the illustrated embodiment, HSIO trace routing 205 is over region 203, comprising a very low-loss dielectric as noted above. HSIO trace routing 205 may be a high-speed data bus requiring ultra-low-loss dielectric material (e.g., exhibiting a Dk<0.01 and Df<0.005) for optimal signal integrity at signal speeds greater than 20 Gbits/sec.

FIG. 2B illustrates a plan view in the x-y plane of mixed dielectric layer 201 of PCB 200, according to some embodiments of the disclosure.

In some embodiments, mixed dielectric layer 201 comprises embedded low Dk regions 114 and 203 and 204 included within host region 113. Embedded regions 114 and 203 have been described above. In some embodiments, embedded region 204 may comprise dielectric material 205 exhibiting a dielectric constant $Dk_4$ that may be intermediate between $Dk_2$ of dielectric material 109 and $Dk_3$ of dielectric material 202. In some embodiments, $Dk_4$ is intermediate between $Dk_1$ of dielectric material 108, and $Dk_2$. Embedded regions 109 and 202 may comprise prepreg patches inlaid into host region 113. In some embodiments, host region 108 comprises a prepreg sheet comprising a high-Dk material (e.g., FR4) as described above. In some embodiments, embedded regions 114, 203 and 204 each comprise a prepreg material, whereby each prepreg material exhibits a corresponding dielectric constant Dk2, Dk3 or Dk4, respectively.

In the illustrated embodiment, embedded regions 114, 201 and 203 have lateral extents that are within the maximum lateral extents of PCB 200. As an example, host region 113 (e.g., comprising dielectric material 108) has substantially the same dimensional extents of PCB 200, having maximum x-y dimensions w5 and w6 (in x and y directions, respectively). For example, region 114 may have x and y lateral dimensions w7 and w8 that are less than maximal lateral extents w5 and w6, respectively. Likewise, for regions 202 and 205, having x and y lateral dimension pairs w9/w10 and w11/w12, respectively.

In the illustrated embodiment, each of the embedded regions 114, 203 and 204 is fully surrounded by host region 113, whereby embedded regions 114, 203 and 204 have boundaries 206, 207 and 208, respectively, each extending completely around the periphery of the corresponding embedded region. In some embodiments, embedded regions 114, 203 and 204 may share boundaries with each other (not shown), having no intervening material from host region 113 between embedded region boundaries.

Multiple embedded regions may support multiple data interfaces on a single PCB. As an example, low-loss dielectric material 109 in embedded region 114 may have a dielectric constant $Dk_2$, supporting a double data rate (DDR) memory interface, comprising parallel routing of multiple data lines for mid-range data speeds (e.g., DDR4 data rate>10 Gbit/sec). Low-loss dielectric material 202 exhibiting dielectric constant $Dk_3<Dk_2$, may support a multi-lane serial interface for a PCI Express (PCIe) HSIO interface, having high data transfer rates (e.g., 8-32 Gbit/sec per lane). Low-loss dielectric material 205 may be an ultra-low-loss material exhibiting a dielectric constant $Dk_4$ (e.g., $Dk_4$ $2.5<Dk_3<Dk_2$), may support a higher-speed HSIO interface (e.g., Thunderbolt v3), where attainable data rates may approach 40 Gbit/sec. Host region 113, comprising a higher-loss dielectric material (e.g., FR4, exhibiting a $Dk_1$ of 4.4) may support low-speed memory or disk-drive data buses.

Figure 3A:
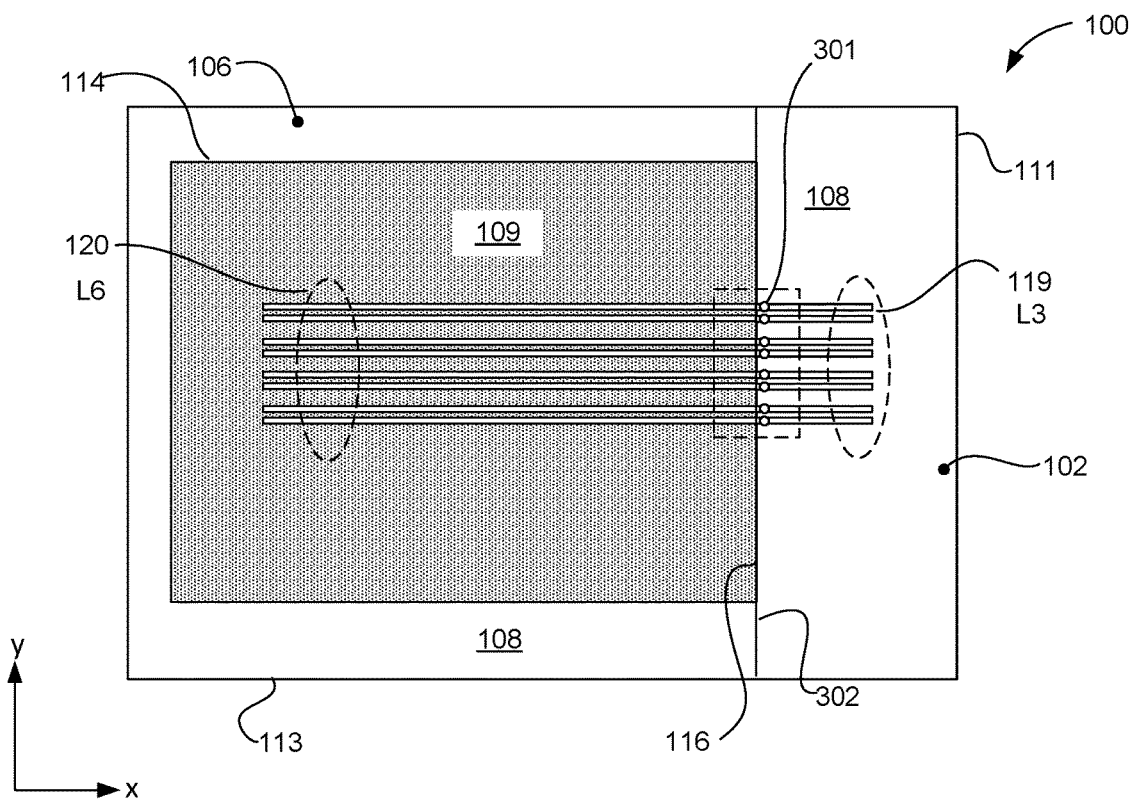
FIG. 3A illustrates a plan view in the x-y plane of a partial stack-up of the PCB shown in FIG. 2A, showing vertical interconnection of HSIO trace topology between conductive layers, according to some embodiments of the disclosure.

FIG. 3A illustrates a plan view in the x-y plane of a partial stack-up of PCB 100, showing vertical interconnection of HSIO trace topology between conductive layers, according to some embodiments of the disclosure.

In the plan view of FIG. 3A, conductive levels L3 and L6 of PCB 100 are exposed to show HSIO trace routing 120 in L6 and HSIO trace routing 119 in L3. Mixed dielectric layer 102, adjacent to L3, is partially illustrated to show only a portion of HSIO trace routing 119 extending over host region 111. HSIO trace routing 120 is confined to region 114, comprising low-Dk dielectric material 109, terminating at boundary 116. In the illustrated example, HSIO trace routing 119 and 120 are grouped into multiple I/O lanes, each lane comprising two traces. HSIO trace routing 119 extends to edge 302 of mixed dielectric layer 102 over host region 111, comprising high-Dk dielectric material 108. Vias 301 may interconnect HSIO trace routing 119 in L3 to HSIO trace routing 120 in L6. HSIO trace routing 119 may be coupled to a high-speed data interface (not shown) coupled to L3. HSIO trace routing 120 in L6 may be coupled to a serial device interface (not shown) within region 114.

Figure 3B:
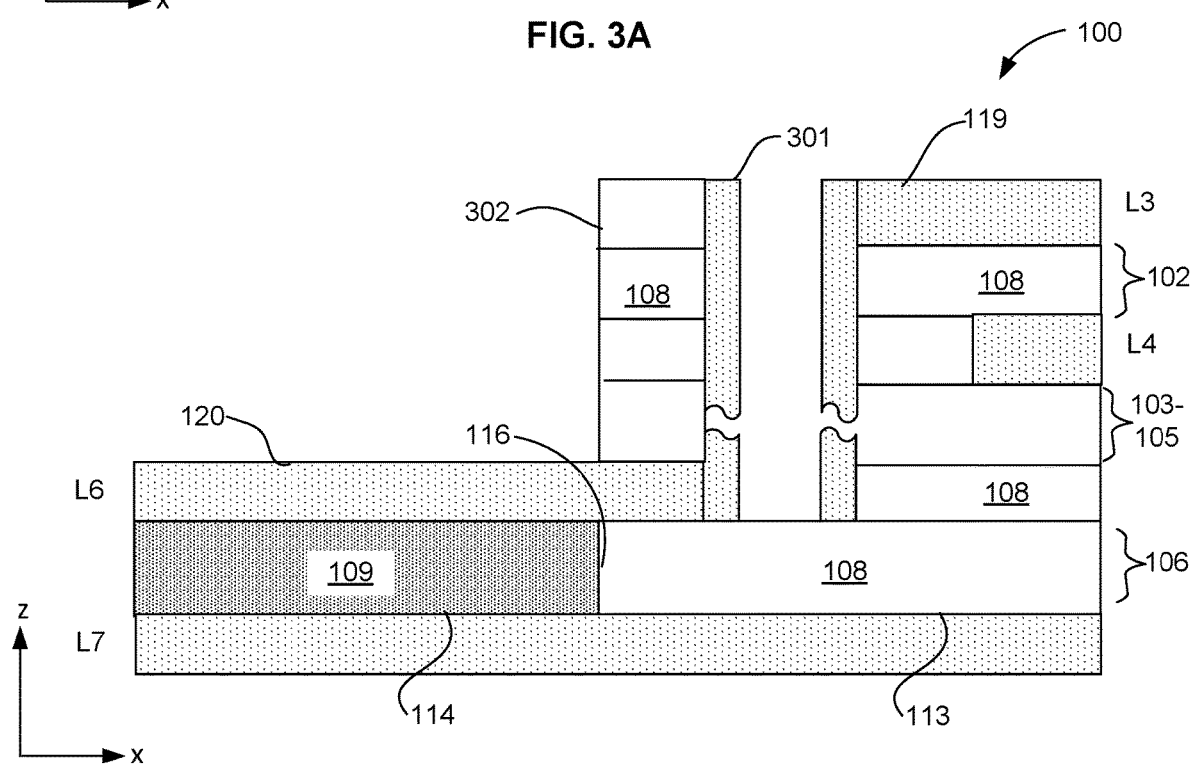
FIG. 3B illustrates a cross-sectional view in the x-z plane of the partial stack-up of the PCB shown in FIG. 3A, according to some embodiments of the disclosure.

FIG. 3B illustrates a cross-sectional view in the x-z plane of the partial stack-up of PCB 100 shown in FIG. 3A, according to some embodiments of the disclosure.

The cross-sectional view of FIG. 3B shows a vertical interconnection of HSIO trace routing 120 in L6 to HSIO trace routing 119 in L3 mediated by via 301. Via 301 extends through dielectric layers 105, 104 and 103 (shown as combined into a single layer in the figure). In the illustrated embodiment, HSIO trace routing 120 extends over low-Dk dielectric material 109, crossing over to high-Dk dielectric material 108 within host region 113 in mixed dielectric layer 106, before attaining via 301. In other embodiments, HSIO trace routing 120 may terminate within embedded region 114 and not cross over boundary 116 to host region 113.

Figure 4A:
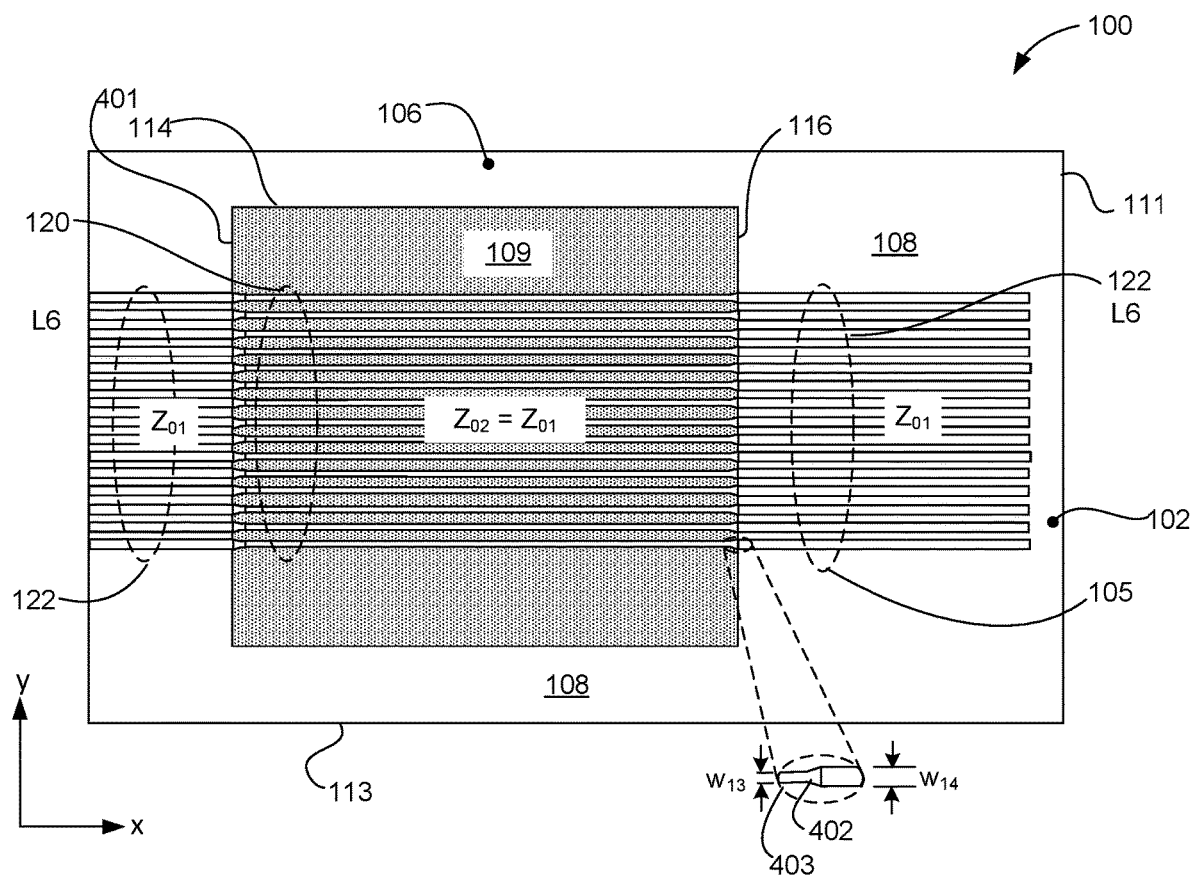
FIG. 4A illustrates a plan view in the x-y plane of a conductive layer within the partial stack-up of the PCB shown in FIG. 1A, according to some embodiments of the disclosure.

FIG. 4A illustrates a plan view in the x-y plane of conductive layer L6 the partial stack-up of PCB 100, according to some embodiments of the disclosure.

In the plan view of FIG. 4A, high-speed parallel interface routing 120 extends in the x-direction over embedded region 114 from boundary 401 (left-side boundary) to boundary 116 (right-side boundary). At boundaries 401 and 116, high-speed parallel interface routing 120 is interconnected with high-speed parallel interface routing 122 extending laterally over host region 113. In the illustrated embodiment, high-speed parallel interface routing 122 may have a width w13, as shown in the inset, producing a strip line characteristic impedance $Z_{01}$ of the individual traces in accordance with the value of dielectric constant Dk1 and thickness (e.g., thickness t, shown in FIG. 4B) of dielectric material 108. Width w13 may be adjusted to closely match $Z_{01}$ a junction impedance (e.g., 50Ω) of devices coupled to high-speed parallel interface routing 122. A discontinuity of dielectric permittivity may be present at boundary 116 between host region 113 (having $Dk_1$) and embedded region 114 (having $Dk_2$, where $Dk_2 < Dk_1$).

According to some embodiments, high-speed parallel interface routing 120 may be impedance-matched to high-speed parallel interface routing 122 to increase return losses as high-speed signals traverse boundary 116. High-speed parallel interface routing 120 may be dimensioned to have a line width w14, producing a characteristic impedance $Z_{02}$ over dielectric material 109. In some embodiments, a dimension transition between w13 of high-speed parallel interface routing 122 and w14 of high-speed interface routing 120 may be present at dielectric boundary 116, whereby $Z_{02}$ may be substantially matched to $Z_{01}$ (e.g., $Z_{01}=Z_{02}$). An example of a width transition of an individual trace 122 is shown in the inset of FIG. 4A. Junction 402 monotonically widens line 403 in high-speed parallel interface routing 120 from w13 to w14 in the vicinity of boundary 116, forming a gradual transition to high-speed parallel interface 122. Similarly, a tapered line width transition may be present in high-speed parallel interface routing 120 or 122 in the vicinity of boundary 401.

Figure 4B:
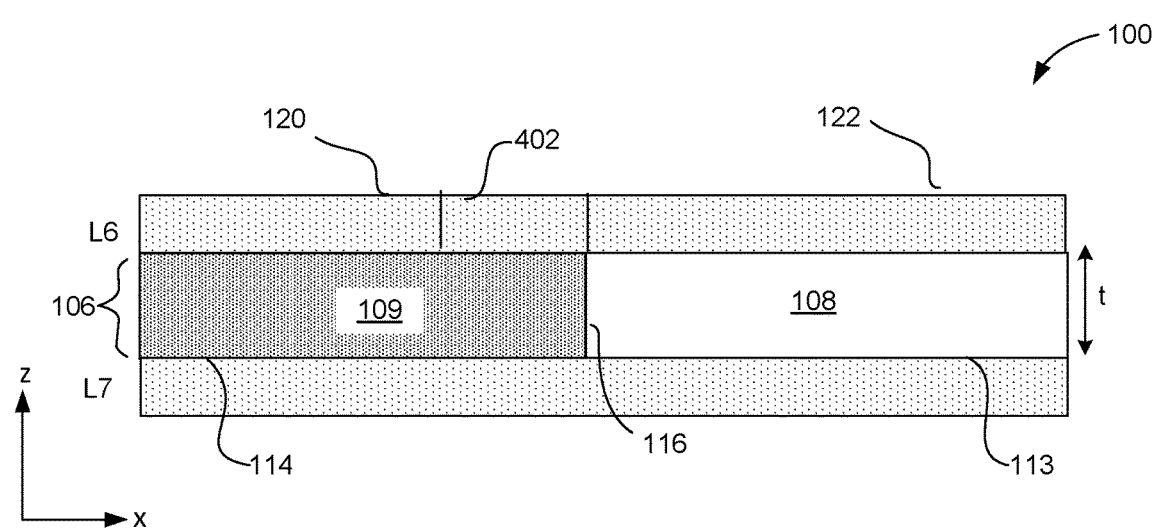
FIG. 4B illustrates a cross-sectional view in the x-z plane of the partial stack-up of PCB shown in FIG. 4A, according to some embodiments of the disclosure.

FIG. 4B illustrates a cross-sectional view in the x-z plane of the partial stack-up of PCB 100 shown in FIG. 4A, according to some embodiments of the disclosure.

In the illustrated embodiment, an enlargement of the cross-section near dielectric boundary 116 is shown. High-speed parallel interface routing 122 is coupled to high-seed parallel interface routing 120 at dielectric boundary 116. During operation, signals coupled to high-speed parallel interface routing 122 may be routed over embedded region 114 to receiving devices located over host region 113.

High-speed parallel interface routing 120 may comprise tapered junction 402 to match transmission line impedances at dielectric boundary 116. As noted above, tapered junction 402 may provide a smooth transition of line width w13 of individual traces within high-speed parallel interface routing 120 to width w14 of traces within high-speed parallel interface routing 122. Line widths w1 and w2 may be optimized to match $Z_{02}$ to $Z_{01}$ at dielectric boundary 116, thereby mitigating reflected power losses.

Characteristic transmission line impedances $Z_{02}$ and $Z_{01}$ of high-speed parallel interface routings 120 and 122, respectively, may be matched by optimizing w13 and w14 in accordance with dielectric materials 108 and 109 (e.g., $Dk_1$ and $Dk_2$) and thickness t of mixed dielectric layer 106. Target impedance values may be 45Ω, 80Ω, and 90Ω, for example.

Figure 5:
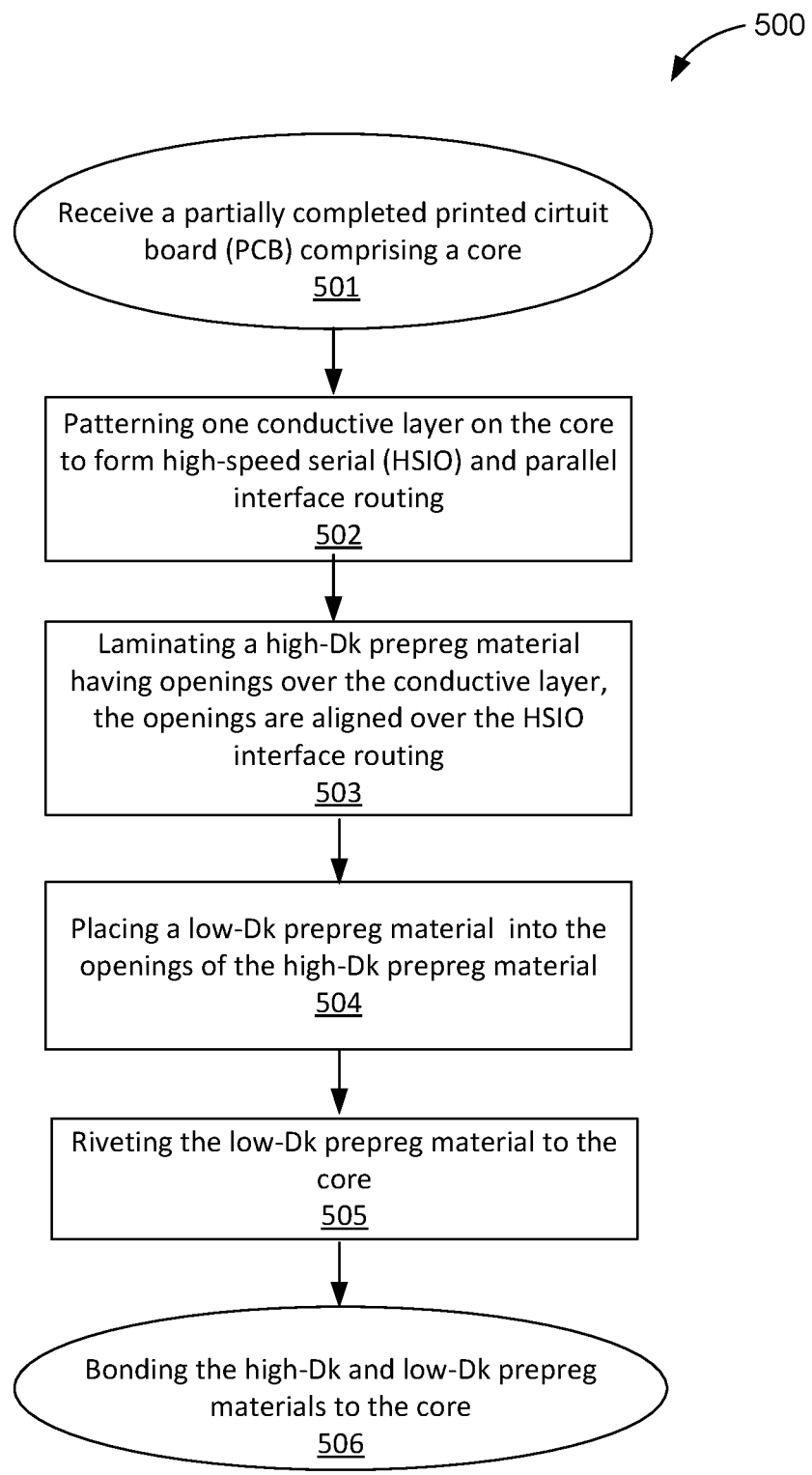
FIG. 5 illustrates a process flow chart for making PCB 100, according to some embodiments of the disclosure.

FIG. 5 illustrates process flow chart 500 for making PCB 100, according to some embodiments of the disclosure.

At operation 501, a partially completed PCB stackup is received. The partially completed PCB stackup comprises a core having a dielectric material clad by two copper layers on opposing sides. One the copper layers may be exposed at the top of the stackup, where the copper layer may be patterned in a subsequent operation.

At operation 502, one copper layer of the core may be patterned to form a HSIO interface routing (e.g., HSIO interface routing 120) and a parallel interface routing (e.g., high-speed parallel interface routing 122). Patterning may be performed by a through-mask etch. The mask may be a lithographically-patterned photoresist. The conductive layer may correspond to L3 or L6 in the stackup of PCB 100, for example.

At operation 503, a high-Dk dielectric material (e.g., dielectric material 108, $Dk_1 > 4$) is laminated over the patterned copper layer. The high-Dk dielectric material may comprise a prepreg material. One or more openings may be preformed in the high-Dk dielectric material prior to lamination. The one or more openings within the high-Dk material may be aligned over the HSIO interface routing within the conductive layer.

At operation 504, a patch comprising a low-Dk dielectric material (e.g., dielectric material 109, $Dk_2 < Dk_1$) may be inlaid in the one or more openings within the high-Dk (e.g., a first prepreg) material. The low Dk dielectric material may comprise a second prepreg material.

At operation 505, the low-Dk material patch is fastened to the core by multiple rivets inserted along a peripheral zone of the low-Dk material patch. The rivets may penetrate through the core, and through lower conductive and dielectric layers within the partially complete PCB stackup. The peripheral zone of the low-Dk material patch may comprise a keep-out zone to exclude circuit routing and other metallization.

At operation 506, the high-Dk prepreg and the low-Dk prepreg patch may be bonded to the conducive and dielectric portions of the core by thermal compression bonding, producing a mixed dielectric layer (e.g., mixed dielectric layer 106) The partially completed PCB stackup may be further built-up to completion after operation 506. Some of the preceding operations may be repeated to include further mixed dielectric layers (e.g., mixed dielectric layer 102).

FIGS. 6A-6G illustrate a method for making mixed-dielectric PCB 100, comprising mixed dielectric layer 106, according to some embodiments of the disclosure.

Figure 6A:
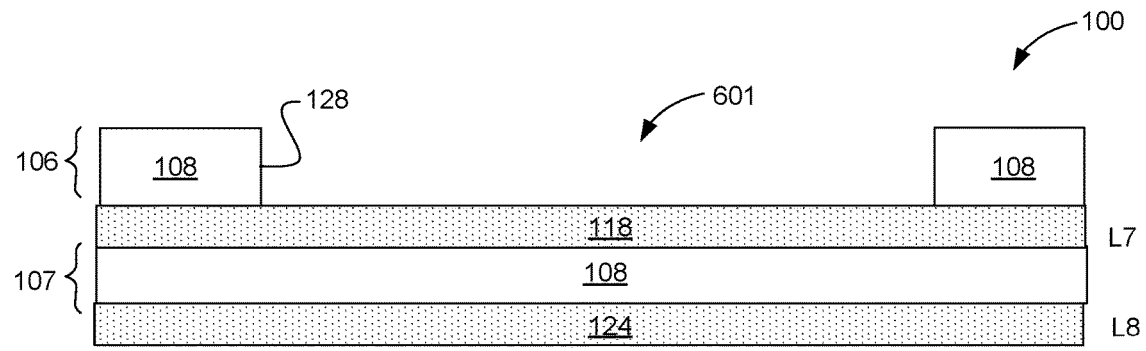
FIGS. 6A-6G illustrate a method for making a mixed-dielectric PCB, comprising a mixed dielectric layer, according to some embodiments of the disclosure.

In FIG. 6A, a partial stackup of PCB 100 is shown. The partial stack-up comprises dielectric layer 107, comprising dielectric material 108. Dielectric material 108 may comprise a relatively high Dk material such as, but not limited to, FR4, and other members of the FR X family. For example, dielectric layer 107 may be a FR-4 sheet having a thickness of approximately 100 microns (e.g., 4 mil). Other suitable specialty formulations for specific material properties may be employed. Notably, materials may be selected for properties such as Tg, CTE as well as permittivity Dk and loss, tan δ or Df. Thicknesses of dielectric material 108 may be selected in accordance with capacitance and transmission line characteristic impedance design specifications. For example, matching CTE between adjacent materials may avoid formation of gaps at region boundaries or shifting of boundaries due to thermal expansion and contraction during heating and cooling (e.g., during and after thermal compression bonding of prepregs during assembly). Suitable matches of Tg between adjacent materials may enable blending of flowable material components at region boundaries when softened or liquified during thermal compression bonding.

Dielectric layer 107 may be a core layer comprising conductive layers 118 and 124 bonded to opposing sides of dielectric layer 107. Conductive layers may comprise copper foil laminates having thicknesses of 17 to 35 microns (e.g., 0.5 oz to 1 oz per ft$^2$). Dielectric material 108 may be a high-Dk prepreg material (e.g., exhibiting Dk1). Dielectric material may be laminated over copper layer 117 and bonded to copper layer 117 by thermal compression bonding. In some embodiments, opening 601 is formed in dielectric material 108 by mechanical or laser cutting a region out of dielectric material 108, creating sidewalls 128. While opening 601 may have a rectangular shape in plan view, opening 601 may have any suitable shape.

Figure 6B:
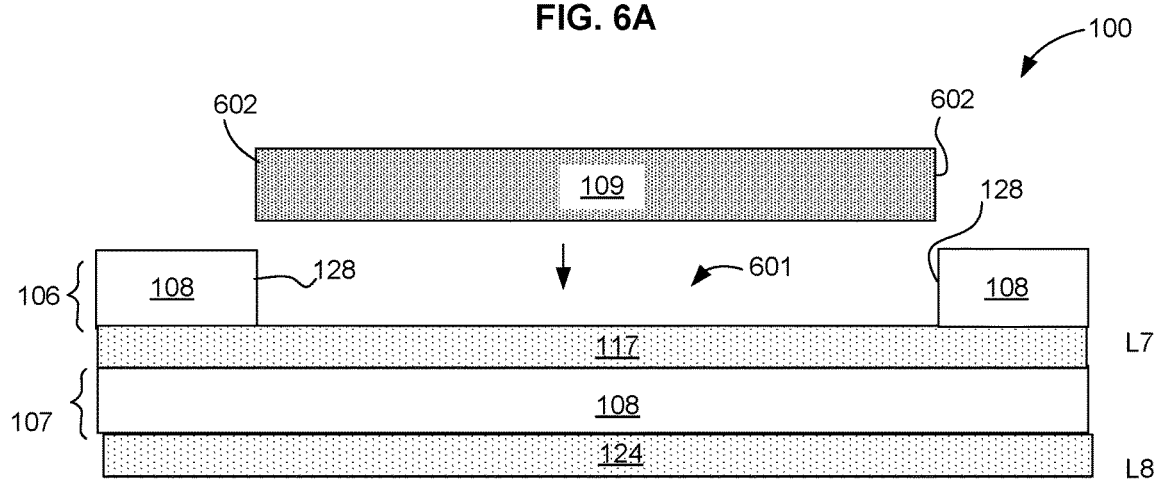

In FIG. 6B, dielectric material 109 is placed within opening 601. Dielectric material 109 may a low-Dk material comprising a prepreg material exhibiting a dielectric constant Dk2. As noted above, Dk2 is less than the dielectric constant of dielectric material 108 (e.g. Dk1). Dielectric material 109 may be precut to size of opening 601 so that sidewalls 602 of material 109 abut sidewalls 128 of material 108.

In the exemplary operation depicted in FIG. 6B, dielectric material 109 may be placed within opening 601 without precoating surfaces with adhesives. Bonding and curing of the prepreg material may be performed in subsequent operations.

Figure 6C:
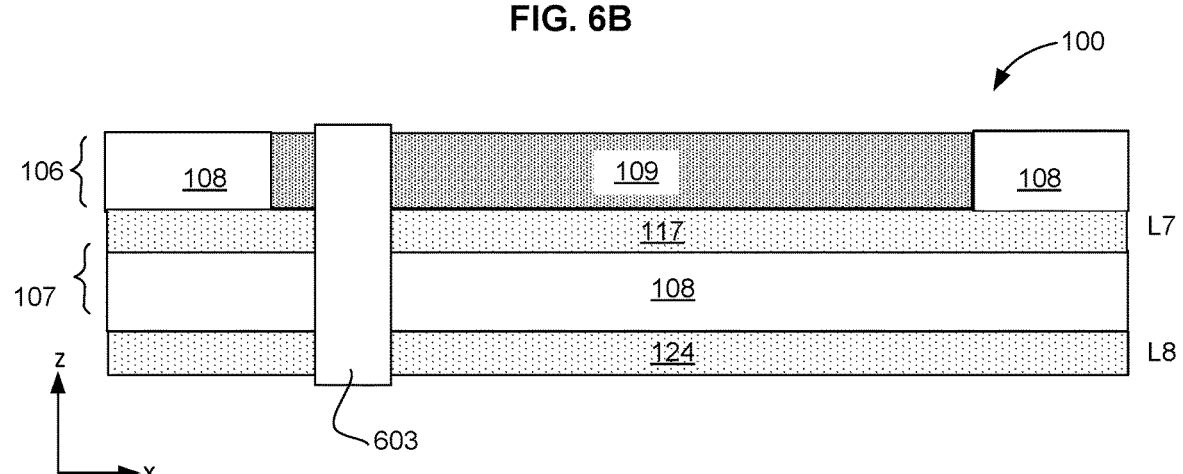

In FIG. 6C, multiple rivets 603 may be inserted along the periphery of material 109 within opening 601. Rivets 603 may penetrate through the lower layers of the partial stackup for PCB 100 as shown to attach material 109 into opening 601 for further processing, Rivets 603 may be attached by an automatic riveting device. Rivets may be attached along peripheral portions of dielectric material 109 to avoid routing in interior portion of dielectric material 109. In some embodiments, mixed dielectric layer 106 is complete. Other dielectric materials (e.g., dielectric material 201).

Figure 6D:
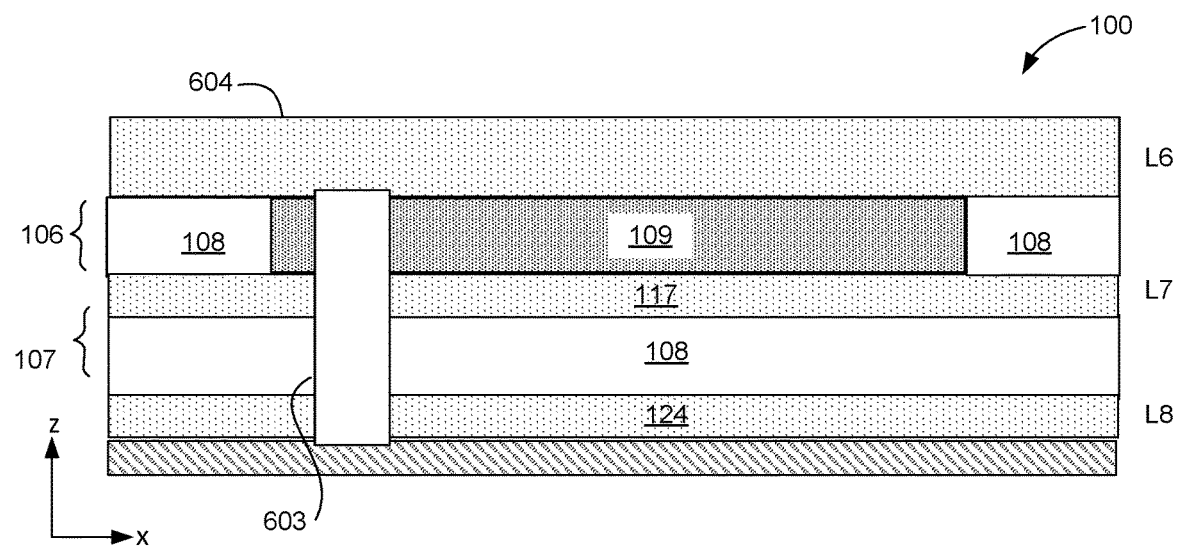

In FIG. 6D, copper foil 604 is laminated over dielectric layer 106 of the partial stackup of PCB 100, forming conductive layer L6. Copper foil 604 may be laminated over dielectric layer 106 by thermal compression bonding. In some embodiments, rivet 603 may be covered by copper foil 604. In some embodiments, copper foil 604 has a thickness ranging from approximately 17 to 35 microns (e.g., 0.6 to 1.2 mils). In subsequent operations, copper foil 604 may be patterned into lithographically defined features by copper etching methods.

Figure 6E:
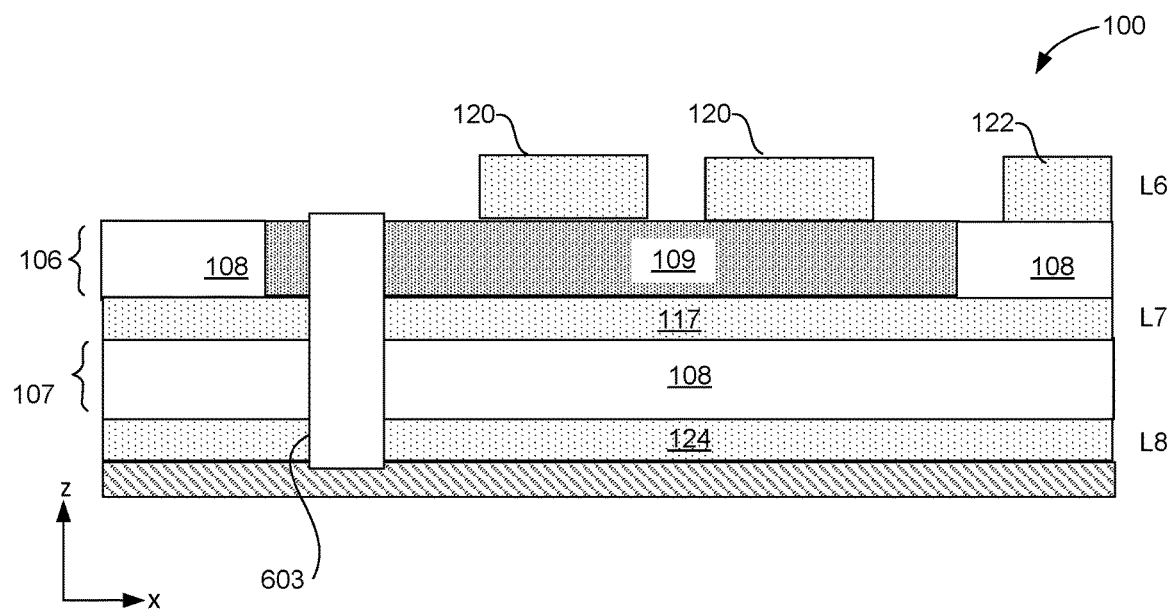

In FIG. 6E, copper foil 604 is patterned to form conductive features in L6. In some embodiments, L6 conductive features comprise HSIO interface routing 120 over dielectric low-Dk material 109 and high-speed parallel interface routing 122 over high-Dk dielectric material 108. Patterning of conductive features within L6 may be performed in a copper etch bath. A photoresist etch mask may be created by lamination of a positive or negative tone photoresist over copper foil 604, followed by exposure through a lithographic mask and development.

Figure 6F:
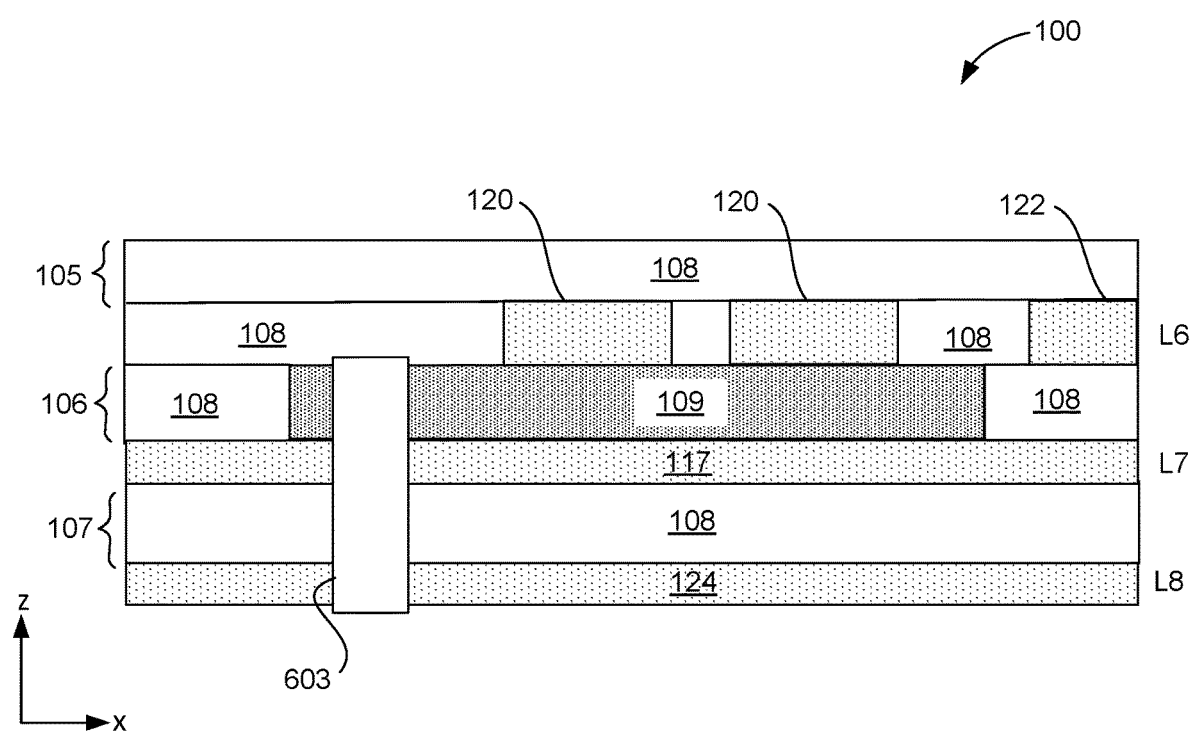

In FIG. 6F, dielectric layer 105 is formed by lamination of dielectric material 108 over L6. Dielectric material 108 may be a prepreg layer that is substantially identical to previously described prepreg applied to dielectric layer 106, and lower dielectric layers such as dielectric layer 107 in the partial stackup shown in FIG. 6A, A thermal compression bonding procedure may be employed to bond and cure the prepreg layer to L6 features and dielectric materials 108 and 109 in mixed dielectric layer 106. Some dielectric material 108 may conformally cover L6 features (e.g. HSIO interface routing 120 and high-speed parallel interface routing 122), as shown.

Figure 6G:
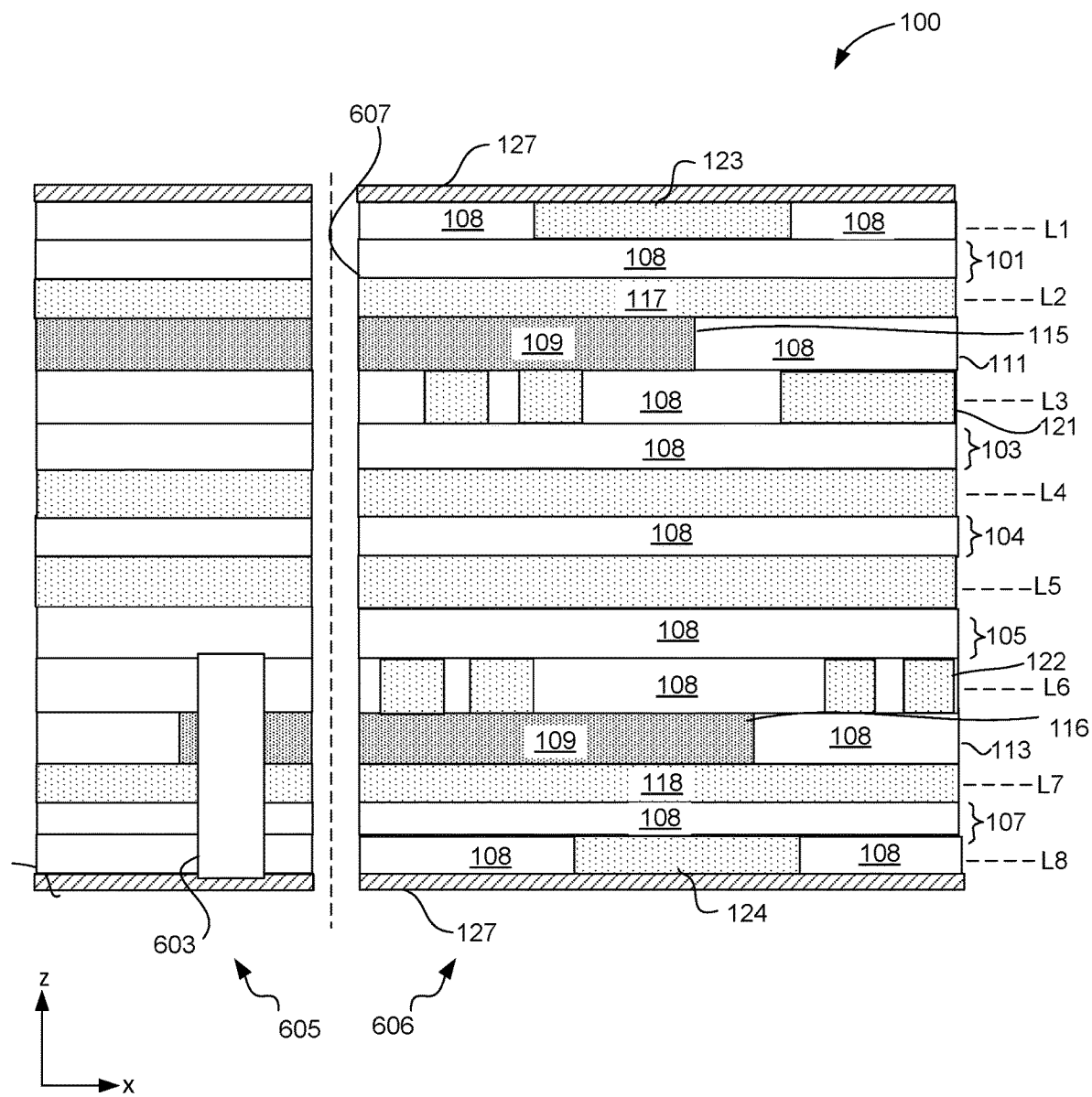

In FIG. 6G, the stackup of PCB 100 is completed to top conductive layer L1, including addition of solder masks 127. Peripheral zone 605, comprising rivet 603, is separated from main portion of stackup 606 by a suitable laser or mechanical cutting method, indicated by the dashed vertical line. Sidewall 607 formed by cutting (e.g., by laser cutting or mechanical sawing), may be one of edges 129 or 130 of PCB 100, for example. Peripheral portion 605 may comprise a keep-out zone excluding trace routing and other conductive features in all conducive levels L1-L8 from peripheral zone 605, confining all routing and conductive features within main portion 606.

Figure 7:
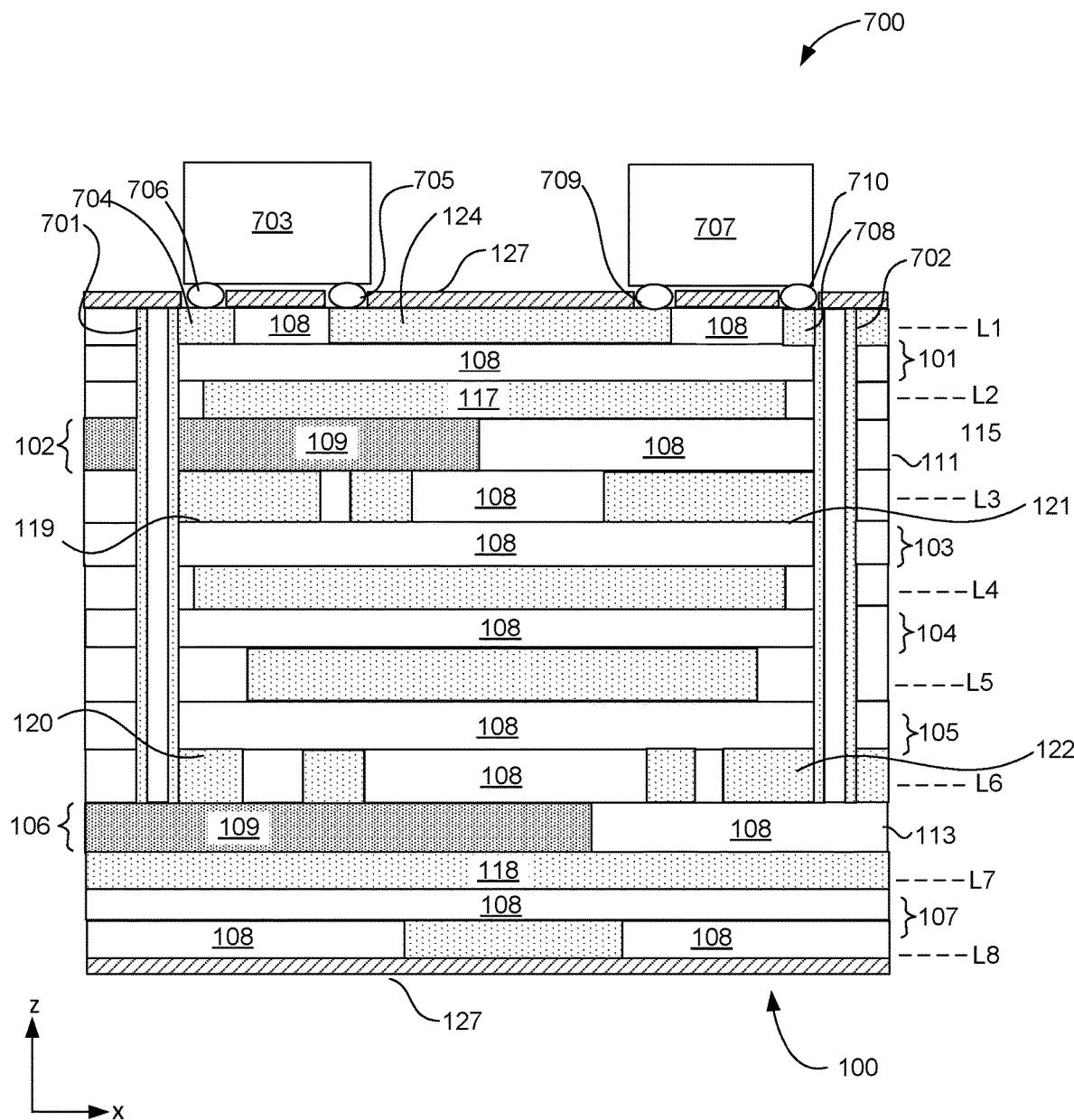
FIG. 7 illustrates a cross-sectional view in the x-z plane of an exemplary implementation of a mixed-dielectric PCB, according to some embodiments of the disclosure.

FIG. 7 illustrates a cross-sectional view in the x-z plane of an exemplary implementation of mixed-dielectric PCB 700, according to some embodiments of the disclosure.

In the illustrated embodiment, the stackup of mixed-dielectric PCB 700 is similar to the stackup of mixed-dielectric PCB 100 shown in FIG. 1A. PCB 700 in includes vias 701 and 702, extending vertically within PCB 700, providing vertical interconnection between conductive layers L1 through L6. Device 703 is coupled to via 701 through pad 704. In the illustrated embodiment, via 701 is electrically coupled to routing 119 in L3 and 120 in L6. In some embodiments, routing 119 is HSIO interface routing. In some embodiments, device 703 may be a HSIO interface, for example a PCIe chip package or daughterboard card slot, having interconnect pins arranged in a dual in-line pin (DIP) architecture. One DIP row may comprise ground pins, coupled to trace 124 in top conductive layer L1 by solder joints 705, while a second DIP row may comprise signal pins coupled to pad 704 in top conductive layer L1 through solder joints 706. Pad 704 may be integral with via 701, as shown. In the illustrated embodiment, via 701 provides a vertical interconnect between HSIO interface 703 coupled to top layer L1, HSIO interface routing 119 and 120 in L3 and L6, respectively.

In a manner similar to HSIO interface 703, device 707 is coupled to via 702 through pad 708. Device 707 may be a high-speed parallel interface, for example a DDR memory. In some embodiments, device 707 may be a chip package or a DIP slot for interfacing a daughterboard, a device or from routing in one layer to another layer within PCB 700. In the illustrated embodiment, pad 708 is integral with via 702, enabling vertical interconnection of high-speed parallel interface 707 to high-speed parallel interface routing 121 or to 122 in L3 and L6.

Figure 8:
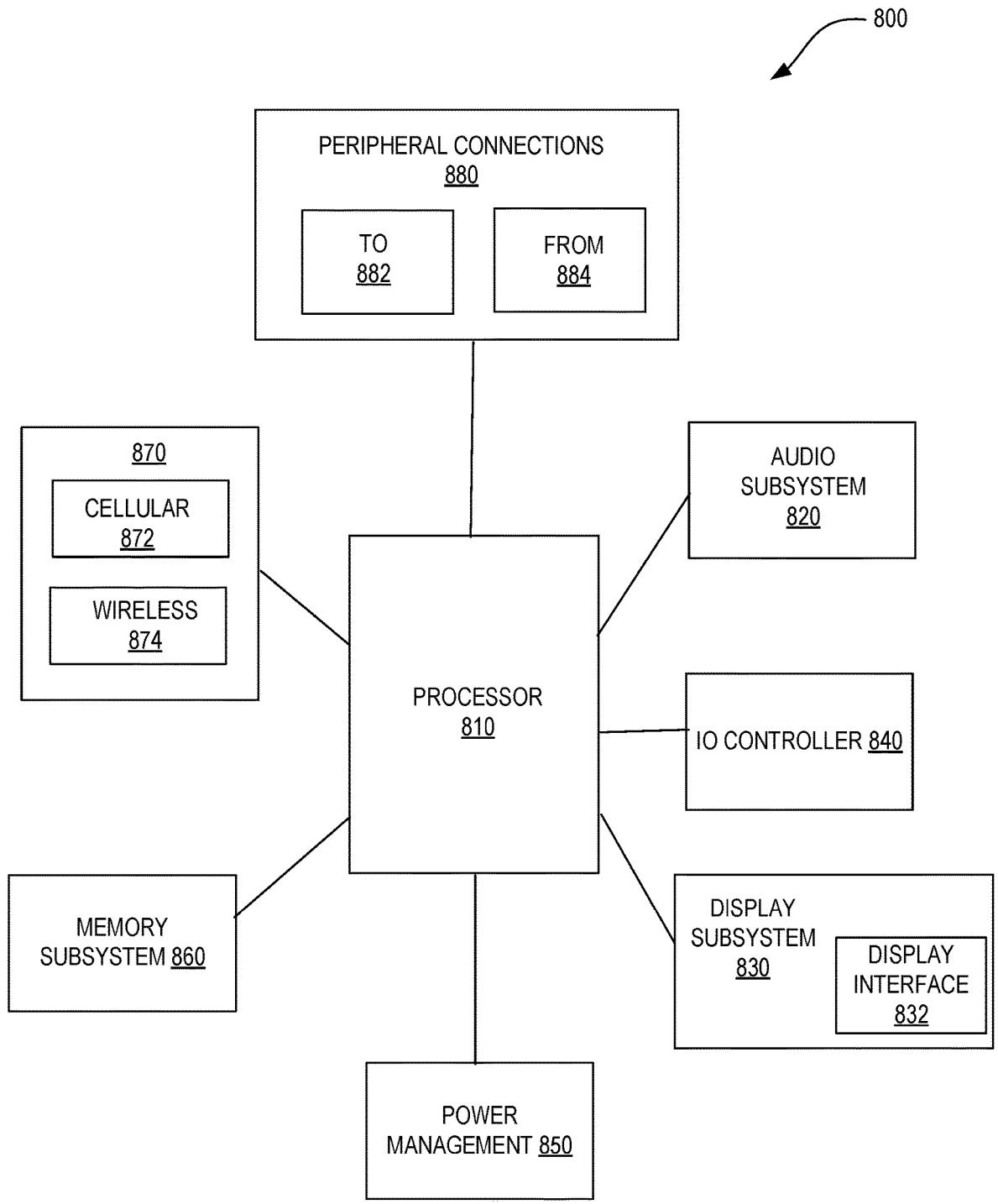
FIG. 8 illustrates a block diagram of a computing device as part of a system-on-chip (SoC) package in an implementation of high-speed serial and parallel memory I/O interface controllers coupled to high-speed serial interface I/O routing on a mixed-dielectric PCB comprising one or more mixed dielectric layers, according to some embodiments of the disclosure.

FIG. 8 illustrates a block diagram of computing device 800 as part of a system-on-chip (SoC) package in an implementation of high-speed serial and parallel I/O interface controllers coupled to high-speed serial interface I/O routing on mixed-dielectric PCB 700, comprising one or more mixed dielectric layers, according to some embodiments of the disclosure.

According to some embodiments, computing device 800 represents a server, a desktop workstation, or a mobile workstation, such as, but not limited to, a laptop computer, a computing tablet, a mobile phone or smart-phone, a wireless-enabled e-reader, or other wireless mobile device. Multichip IC packages, such as, but not limited to, a single- or multi-core microprocessor (e.g., representing a central processing unit), logic dies, RF dies, high power dies, memory dies, antenna dies, comprises a packages substrate having, for example.

In some embodiments, computing device has wireless connectivity (e.g., Bluetooth, WiFi and 5G network). It will be understood that certain components are shown generally, and not all components of such a device are shown in computing device 800.

The various embodiments of the present disclosure may also comprise a network interface within 870 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 810 represents a CPU or a GPU, and can include one or more physical devices, such as microprocessors, application processors, microcontrollers, programmable logic devices, or other processing means. Processor 810 may be coupled to a memory controller or high-speed serial I/O interface controller, as disclosed. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is a printed circuit board (PCB), comprising a first layer comprising a first dielectric material substantially exclusively; and a second layer comprising the first dielectric material within a first region and a second dielectric material within a second region adjacent to first region, wherein the first dielectric material has a first dielectric constant, a first coefficient of thermal expansion (CTE) and a first glass transition temperature (Tg) the second dielectric material has a second dielectric constant, a second CTE and a second Tg the first dielectric constant is a greater than the second dielectric constant, the first CTE is substantially equal to the second CTE; and the first Tg and the second Tg are greater than 150° C.

Example 2 includes all of the features of example 1, wherein a first boundary between the first region and the second region extends around the periphery of the second region.

Example 3 includes all of the features of example 2, wherein the first dielectric material is mixed with the second dielectric material the first boundary.

Example 4 includes all of the features of examples 2 or 3, wherein a first sidewall of the first region is adjacent to a second sidewall of the second region at the first boundary.

Example 5 includes all of the features of example 4, wherein a first distance between the first sidewall and the second sidewall is between zero and 10 microns.

Example 6 includes all of the features of any one of examples 1 through 5, wherein the second layer further comprises a third dielectric material within a third region adjacent to the first region.

Example 7 includes all of the features of example 6, wherein a second boundary between the first region and the third region extends around the periphery of the third region.

Example 8 includes all of the features of examples 6 or 7, wherein the third dielectric material has a third dielectric constant that is less than the second dielectric constant, a third Tg that is substantially equal to the first Tg and the second Tg, and a third CTE that is substantially equal to the first CTE and the second CTE.

Example 9 includes all of the features of any one of examples 1 through 8, wherein a first core layer is between the first layer and the second layer, the first core layer having a first surface and an opposing second surface, wherein a first copper layer is over the first surface and a second copper layer is over the second surface, and wherein the first core layer comprises a fourth dielectric material having a fourth dielectric constant that is less than the first dielectric constant.

Example 10 includes all of the features of example 9, further comprising a third layer, wherein the third layer comprises a fourth region and a fifth region adjacent to the fourth region, and wherein the fourth region comprises a fifth material having a fifth dielectric constant, and the fifth region comprising a sixth material having a sixth dielectric constant.

Example 11 includes all of the features of example 10, wherein a second core layer is between the first layer and the third layer, the second core layer having a third surface and an opposing fourth surface, wherein a third copper layer is over the third surface and a fourth copper layer is over the fourth surface, and wherein the second core layer comprises a seventh dielectric material having a seventh dielectric constant that is less than the first dielectric constant.

Example 12 includes all of the features of any one of examples 1 through 11, wherein the first dielectric constant is at least 0.3 units greater than the second dielectric constant.

Example 13 is a system, comprising a printed circuit board (PCB) comprising a first layer comprising a first dielectric material substantially exclusively; and a second layer comprising the first dielectric material within a first region and a second dielectric material within a second region adjacent to first region, wherein the first dielectric material has a first dielectric constant, a first coefficient of thermal expansion (CTE) and a first glass transition temperature (Tg), the second dielectric material has a second dielectric constant, a second CTE and a second Tg, the first dielectric constant is greater than the second dielectric constant, the first CTE is substantially equal to the second CTE; and the first Tg and the second Tg are greater than 150° C., a first routing over the first region of the second layer; and a second routing over the second region of the second layer.

Example 14 includes all of the features of example 13, wherein the first routing is a first portion of a parallel memory interface routing or a chip package routing that extends over the second region of the second layer.

Example 15 includes all of the features of example 14, wherein a second portion of the parallel memory interface routing is over the first layer.

Example 16 includes all of the features of any one of examples 13 through 15, wherein the HSIO serial interface routing is a first HSIO serial interface routing, and a second HSIO serial interface routing is over the third region of the second layer.

Example 17 includes all of the features of example 16, wherein the HSIO serial interface routing or a chip package routing that extends over the first region of the second layer.

Example 18 includes all of the features of any one of examples 13 through 17, wherein the second layer comprises a third region, wherein the third region comprises a third material having a third dielectric constant that is substantially different from the second dielectric constant.

Example 19 includes all of the features of any one of examples 1 through 18, further comprising a third layer, wherein the third layer comprises a fourth region and a fifth region adjacent to the fourth region, and wherein the fourth region comprises a fourth material having the first dielectric constant, and the fifth region comprises a fifth material having the second dielectric constant.

Example 20 is a method for making a printed circuit board (PCB), comprising receiving a PCB layer stack comprising a core, wherein the core comprises a dielectric layer comprising a first dielectric material exclusively, wherein the first dielectric material has a first dielectric constant, and wherein a first conductive layer is over a first side of the first dielectric layer and a second conductive layer is over an opposing second side of the first dielectric layer), patterning the first conductive layer to form high-speed interface routing; comprising a high-speed input/output (HSIO) interface routing and a high-speed parallel interface routing; and laminating a first prepreg sheet comprising the first dielectric material over the first conductive layer, wherein the first prepreg sheet comprises one or more openings, and riveting a second prepreg sheet in the one or more openings in the second dielectric layer, wherein the second prepreg sheet has a second dielectric constant that is substantially different than the first dielectric constant.

Example 21 includes all of the features of example 20, wherein patterning the second copper layer comprises forming a high-speed input/output (HSIO) interface routing and a high-speed parallel interface routing.

Example 22 includes all of the features of example 21, wherein laminating the second dielectric layer over the first conductive layer comprises aligning the one or more openings over the HSIO interface routing Example 23 includes all of the features of any one of examples 20 through 22, wherein riveting the second prepreg sheet in the one or more openings comprises driving a plurality of rivets along a peripheral zone of the second prepreg sheet to fasten the second prepreg sheet to the PCB core.

Example 24 includes all of the features of any one of examples 20 through 23, further comprising riveting a third prepreg sheet in the one or more openings, wherein riveting a third prepreg sheet comprises driving a plurality of rivets along a peripheral zone of the third prepreg sheet to fasten the third prepreg sheet to the PCB core.

An abstract is submitted with the understanding that it will not be used to limit the scope or meaning of the claims.

The following claims are hereby incorporated into the detailed description, with each claim standing on its own as a separate embodiment.

We claim:

1. A printed circuit board (PCB), comprising:
   a first layer comprising a first dielectric material substantially exclusively; and
   a second layer comprising the first dielectric material within a first region and a second dielectric material within a second region adjacent to the first region, wherein:
   the first dielectric material has a first dielectric constant, a first coefficient of thermal expansion (CTE) and a first glass transition temperature (Tg);
   the second dielectric material has a second dielectric constant, a second CTE and a second Tg;
   the first dielectric constant is a greater than the second dielectric constant;
   the first CTE is substantially equal to the second CTE; and
   the first Tg and the second Tg are greater than 150° C.

2. The PCB of claim 1, wherein a first boundary between the first region and the second region extends around a periphery of the second region.

3. The PCB of claim 2, wherein the first dielectric material is mixed with the second dielectric material at the first boundary.

4. The PCB of claim 2, wherein a first sidewall of the first region is adjacent to a second sidewall of the second region at the first boundary.

5. The PCB of claim 4, wherein a first distance between the first sidewall and the second sidewall is between zero and 10 microns.

6. The PCB of claim 1, wherein the second layer further comprises a third dielectric material within a third region adjacent to the first region.

7. The PCB of claim 6, wherein a boundary between the first region and the third region extends around a periphery of the third region.

8. The PCB of claim 6, wherein the third dielectric material has a third dielectric constant that is less than the second dielectric constant, a third Tg that is substantially equal to the first Tg and the second Tg, and a third CTE that is substantially equal to the first CTE and the second CTE.

9. The PCB of claim 1, wherein a first core layer is between the first layer and the second layer, the first core layer having a first surface and an opposing second surface, wherein a first copper layer is over the first surface and a second copper layer is over the second surface, and wherein the first core layer comprises a fourth dielectric material having a fourth dielectric constant that is less than the first dielectric constant.

10. The PCB of claim 9, further comprising a third layer, wherein the third layer comprises a fourth region and a fifth region adjacent to the fourth region, and wherein the fourth region comprises a fifth material having a fifth dielectric constant, and the fifth region comprising a sixth material having a sixth dielectric constant.

11. The PCB of claim 10, wherein a second core layer is between the first layer and the third layer, the second core layer having a third surface and an opposing fourth surface, wherein a third copper layer is over the third surface and a fourth copper layer is over the fourth surface, and wherein the second core layer comprises a seventh dielectric material having a seventh dielectric constant that is less than the first dielectric constant.

12. The PCB of claim 1, wherein the first dielectric constant is at least 0.3 units greater than the second dielectric constant.

13. A system, comprising:
a printed circuit board (PCB) comprising:
a first layer comprising a first dielectric material substantially exclusively; and
a second layer comprising the first dielectric material within a first region and a second dielectric material within a second region adjacent to the first region, wherein:
the first dielectric material has a first dielectric constant, a first coefficient of thermal expansion (CTE) and a first glass transition temperature (Tg);
the second dielectric material has a second dielectric constant, a second CTE and a second Tg;
the first dielectric constant is greater than the second dielectric constant;
the first CTE is substantially equal to the second CTE; and
the first Tg and the second Tg are greater than 150° C.,
a first routing over the first region of the second layer; and
a second routing over the second region of the second layer.

14. The system of claim 13, wherein the first routing is a first portion of a parallel memory interface routing or a chip package routing that extends over the second region of the second layer.

15. The system of claim 14, wherein a second portion of the parallel memory interface routing is over the first layer.

16. The system of claim 13, wherein the second routing is a portion of a HSIO serial interface routing or a chip package routing that extends over the first region of the second layer.

17. The system of claim 16, wherein the HSIO serial interface routing is a first HSIO serial interface routing, and a second HSIO serial interface routing is over a third region of the second layer.

18. The system of claim 13, wherein the second layer comprises a third region, wherein the third region comprises a third material having a third dielectric constant that is substantially different from the second dielectric constant.

19. The system of claim 13, further comprising a third layer, wherein the third layer comprises a fourth region and a fifth region adjacent to the fourth region, and wherein the fourth region comprises a fourth material having the first dielectric constant, and the fifth region comprises a fifth material having the second dielectric constant.

20. A method for making a printed circuit board (PCB), comprising:
receiving a PCB layer stack comprising a core, wherein the core comprises a dielectric layer comprising a first dielectric material exclusively, wherein the first dielectric material has a first dielectric constant, and wherein a first conductive layer is over a first side of the first dielectric layer and a second conductive layer is over an opposing second side of the first dielectric layer;
patterning the first conductive layer to form high-speed interface routing comprising a high-speed input/output (HSIO) interface routing and a high-speed parallel interface routing;
laminating a first prepreg sheet comprising the first dielectric material over the first conductive layer, wherein the first prepreg sheet comprises one or more openings; and
riveting a second prepreg sheet in the one or more openings in the first prepreg sheet, wherein the second prepreg sheet has a second dielectric constant that is substantially different than the first dielectric constant.

21. The method of claim 20, wherein laminating the first prepreg sheet over the first conductive layer comprises aligning the one or more openings over the HSIO interface routing.

22. The method of claim 20, wherein riveting the second prepreg sheet in the one or more openings comprises driving a plurality of rivets along a peripheral zone of the second prepreg sheet to fasten the second prepreg sheet to the core.

23. The method of claim 20, further comprising riveting a third prepreg sheet in the one or more openings, wherein riveting the third prepreg sheet comprises driving a plurality of rivets along a peripheral zone of the third prepreg sheet to fasten the third prepreg sheet to the core.

* * * * *